United States Patent
Tong

(10) Patent No.: US 8,248,054 B2
(45) Date of Patent: Aug. 21, 2012

(54) ON/OFF DETECTION CIRCUIT HAVING FUNCTION FOR TIMELY DETECTING CURRENT FLOWING IN ELECTRONIC DEVICE

(75) Inventor: Song-Lin Tong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 185 days.

(21) Appl. No.: 12/794,790

(22) Filed: Jun. 7, 2010

(65) Prior Publication Data

US 2011/0234192 A1 Sep. 29, 2011

(30) Foreign Application Priority Data

Mar. 25, 2010 (CN) .......................... 2010 1 0132352

(51) Int. Cl.
G05F 1/56 (2006.01)
G05F 1/565 (2006.01)
G05F 1/569 (2006.01)

(52) U.S. Cl. .......................... 323/311; 323/316; 323/317

(58) Field of Classification Search .................. 323/266, 323/268–272, 277–283, 285–286, 299, 232, 323/311–313, 316–317; 361/139, 150–154
See application file for complete search history.

(56) References Cited

U.S. PATENT DOCUMENTS

| | | | | |
|---|---|---|---|---|
| 3,895,287 A * | 7/1975 | Sun et al. | ....................... | 323/258 |
| 3,970,897 A * | 7/1976 | Tamir et al. | ..................... | 361/23 |
| 3,995,200 A * | 11/1976 | Stolarczyk | ....................... | 361/48 |
| 4,412,245 A * | 10/1983 | Kwok | ........................... | 725/149 |
| 4,456,943 A * | 6/1984 | Judy | ............................. | 361/160 |
| 5,095,399 A * | 3/1992 | Terada et al. | ................ | 361/93.6 |
| 5,701,352 A * | 12/1997 | Williamson, III | ........... | 381/104 |
| 5,790,364 A * | 8/1998 | Mikami et al. | ................ | 361/154 |
| 5,859,527 A * | 1/1999 | Cook | ........................... | 323/298 |
| 6,069,471 A * | 5/2000 | Nguyen | ....................... | 323/271 |
| 6,688,715 B2 * | 2/2004 | Estelle | ......................... | 324/525 |
| 6,934,140 B1 * | 8/2005 | Rober et al. | ................... | 361/154 |
| 2003/0038545 A1 * | 2/2003 | Chang | .......................... | 307/10.7 |
| 2008/0042862 A1 * | 2/2008 | Chen et al. | .................... | 340/649 |
| 2011/0221373 A1 * | 9/2011 | Tong et al. | .................... | 318/490 |
| 2011/0241891 A1 * | 10/2011 | Tong | ............................. | 340/650 |
| 2011/0260542 A1 * | 10/2011 | Ge | ................................. | 307/66 |

* cited by examiner

*Primary Examiner* — Matthew Nguyen
*Assistant Examiner* — Nusrat Quddus
(74) *Attorney, Agent, or Firm* — Altis Law Group, Inc.

(57) ABSTRACT

An ON/OFF detection circuit for detecting an electronic device includes a switch circuit, a current sampling circuit, an amplifying circuit, and a control circuit. The switch circuit includes an input terminal connected to a constant voltage source, an output terminal coupled to the electronic device, and a control terminal. The current sampling circuit is connected between the input terminal and the output terminal of the switch circuit, and is configured for sampling current flowing to the electronic device and converting sampled current into sampled voltage. The amplifying circuit is configured for filtering and amplifying the sampled voltage. The control circuit controls the ON and OFF of the electronic device and compares the sampled voltages with a comparison voltage to judge the electronic device is qualify or disqualify.

9 Claims, 4 Drawing Sheets

ON/OFF DETECTION CIRCUIT HAVING FUNCTION FOR TIMELY DETECTING CURRENT FLOWING IN ELECTRONIC DEVICE

BACKGROUND

1. Technical Field

The present disclosure relates to detection circuits and, particularly, to an ON/OFF detection circuit capable of timely detecting current flowing in electronic devices.

2. Description of Related Art

Many electronic products need to be tested before delivering. One of the more important tests is the ON/OFF test for ensuring the reliability of the electronic products. Traditionally, the ON/OFF test is to turn on and off the electronic products automatically about 5000 times using a test machine. The quality of the tested electronic device is checked after finishing the ON/OFF tests. However, the operation status of the electronic device must be tested again to assure whether the electronic device has broken down during the ON/OFF testing process. It is time consuming and wasteful of resources.

Therefore, it is desirable to provide an ON/OFF detection circuit which can overcome the limitations described above.

DETAILED DESCRIPTION

Embodiments of the disclosure will now be described in detail, with reference to the accompanying drawings.

Figure 1:
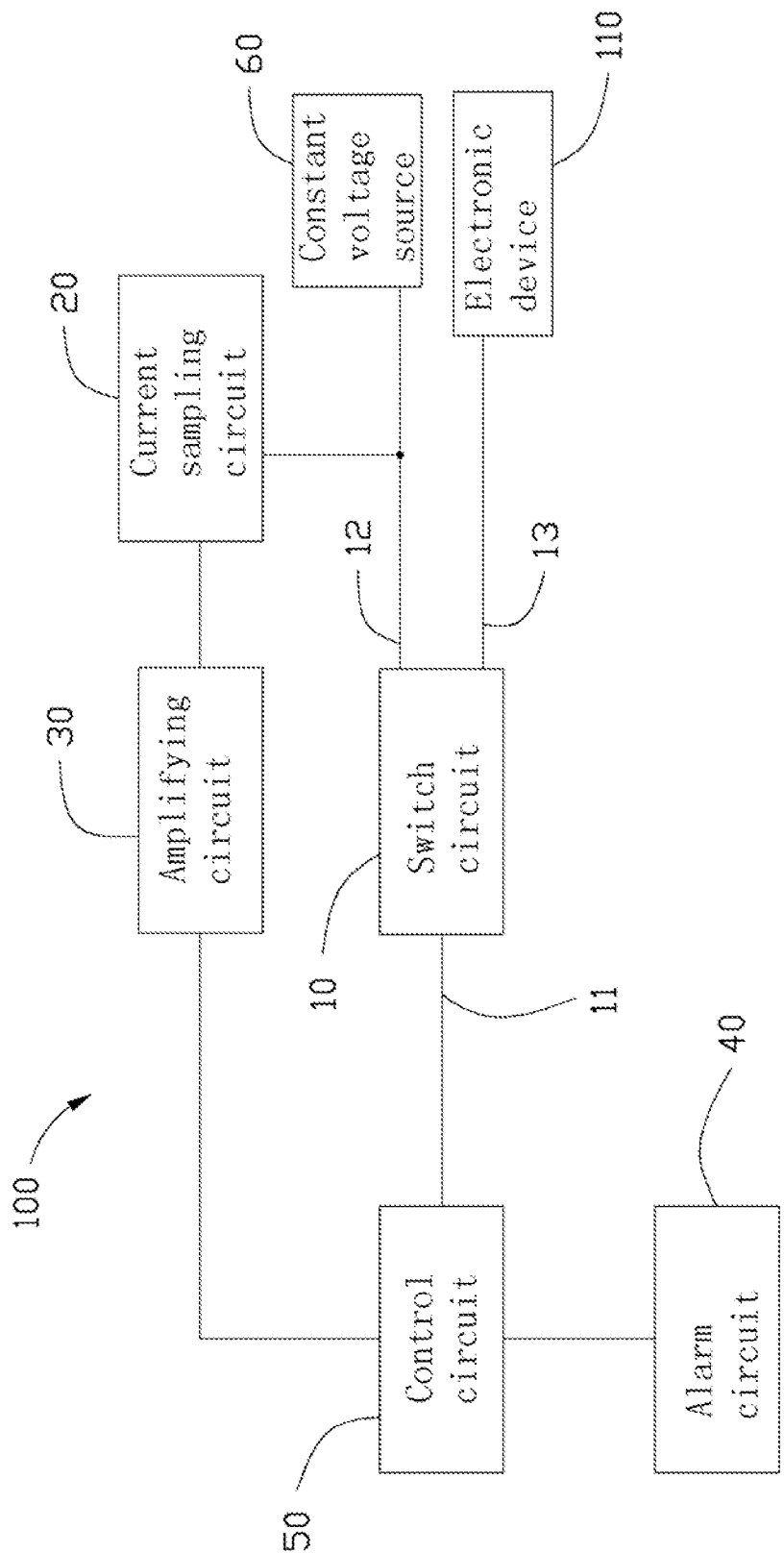
FIG. 1 is a functional block diagram of an ON/OFF detection circuit, according to an exemplary embodiment.

Referring to FIG. 1, an ON/OFF detection circuit 100, according to an exemplary embodiment, is configured for timely detecting current flowing in electronic devices 110. The ON/OFF detection circuit 100 includes a switch circuit 10, a current sampling circuit 20, a current amplifying circuit 30, an alarm circuit 40, and a control circuit 50. The switch circuit 10 is connected with the current sampling circuit 20 and the control circuit 50. The amplifying circuit 30 is connected between the current sampling circuit 20 and the control circuit 50. The alarm circuit 40 is coupled with the control circuit 50.

Figure 2:
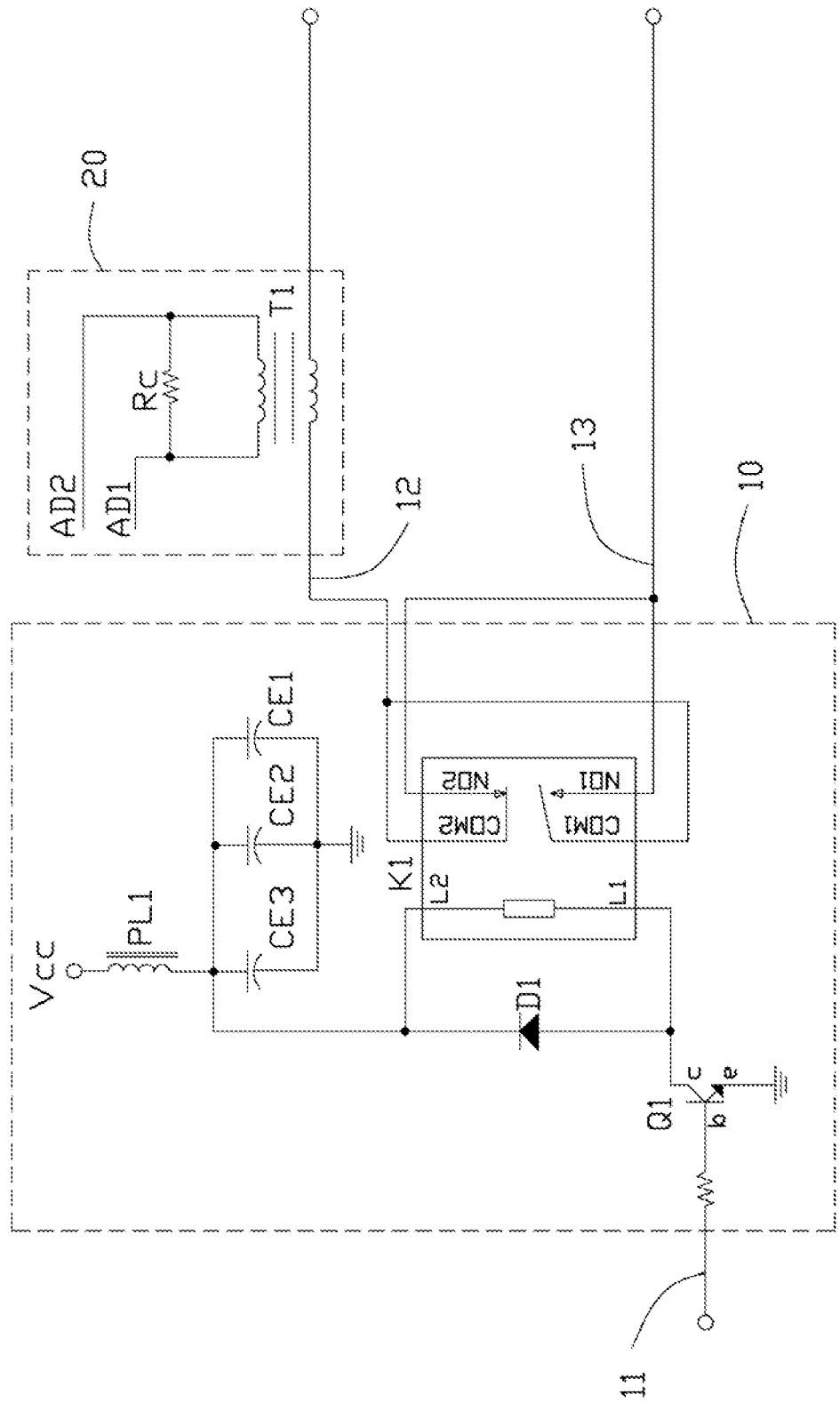
FIG. 2 is a circuit diagram of a switch circuit and a current sampling circuit of the ON/OFF detection circuit of FIG. 1.

Referring to FIG. 2, the switch circuit 10 includes an inductor PL1, a first capacitor CE1, a second capacitor CE2, a third capacitor CE3, a relay K1, a first diode D1, and a first transistor Q1. The inductor PL1 includes a first terminal coupled to a power source Vcc of about 12 volts (V), and a second terminal connected to a cathode of the first diode D1. All of positive terminals of the first capacitor CE1, the second capacitor CE2, and the third capacitor CE3 are connected to the cathode of the first diode D1, while all of negative terminals of the first capacitor CE1, the second capacitor CE2, and the third capacitor CE3 are grounded. The first transistor Q1 is an NPN type, and includes a collector "c" connected to an anode of the first diode D1, an emitter "e" being grounded, and a base "b" as a control terminal 11 of the switch circuit 10. The relay K1 includes an L1 terminal, an L2 terminal, a COM1 terminal, a COM2 terminal, an NO1 terminal, and an NO2 terminal. The L1 terminal and the L2 terminal are connected to the anode and the cathode of the first diode D1 respectively. The COM1 terminal and the COM2 terminal are electrically interconnected to cooperatively serve as an input terminal 12 of the switch circuit 10. The NO1 terminal and the NO2 terminal are electrically interconnected to cooperatively serve as an output terminal 13 of the switch circuit 10. When the control terminal 11 is at a low level (e.g., logical "0"), the collector "c" and the emitter "e" of the first transistor Q1 are disconnected. As a consequence, the relay K1 is disconnected, while the input terminal 12 and the output terminal 13 are disconnected. When the control terminal 11 is at a high level (e.g., logical "1"), the collector "c" and the emitter "e" of the first transistor Q1 are coupled. As a consequence, the relay K1 is connected, and the input terminal 12 and the output terminal 13 are connected.

The current sampling circuit 20 includes a current transformer T1 and a sampling resistor Rc. The current transformer T1 includes a primary coil and a secondary coil. The primary coil is connected between the input terminal 12 of the switch circuit 10 and a constant voltage source 60. The secondary coil and the sampling resistor Rc are connected in parallel. The current transformer T1 is configured for sampling a current flowing to the electronic device 110. The sampling resistor Rc converts the sampled current flowing in the secondary coil into a sampled voltage. A first terminal of the sampling resistor Rc serves as an AD1 terminal, and a second terminal of the sampling resistor Rc serves as an AD2 terminal.

Figure 3:
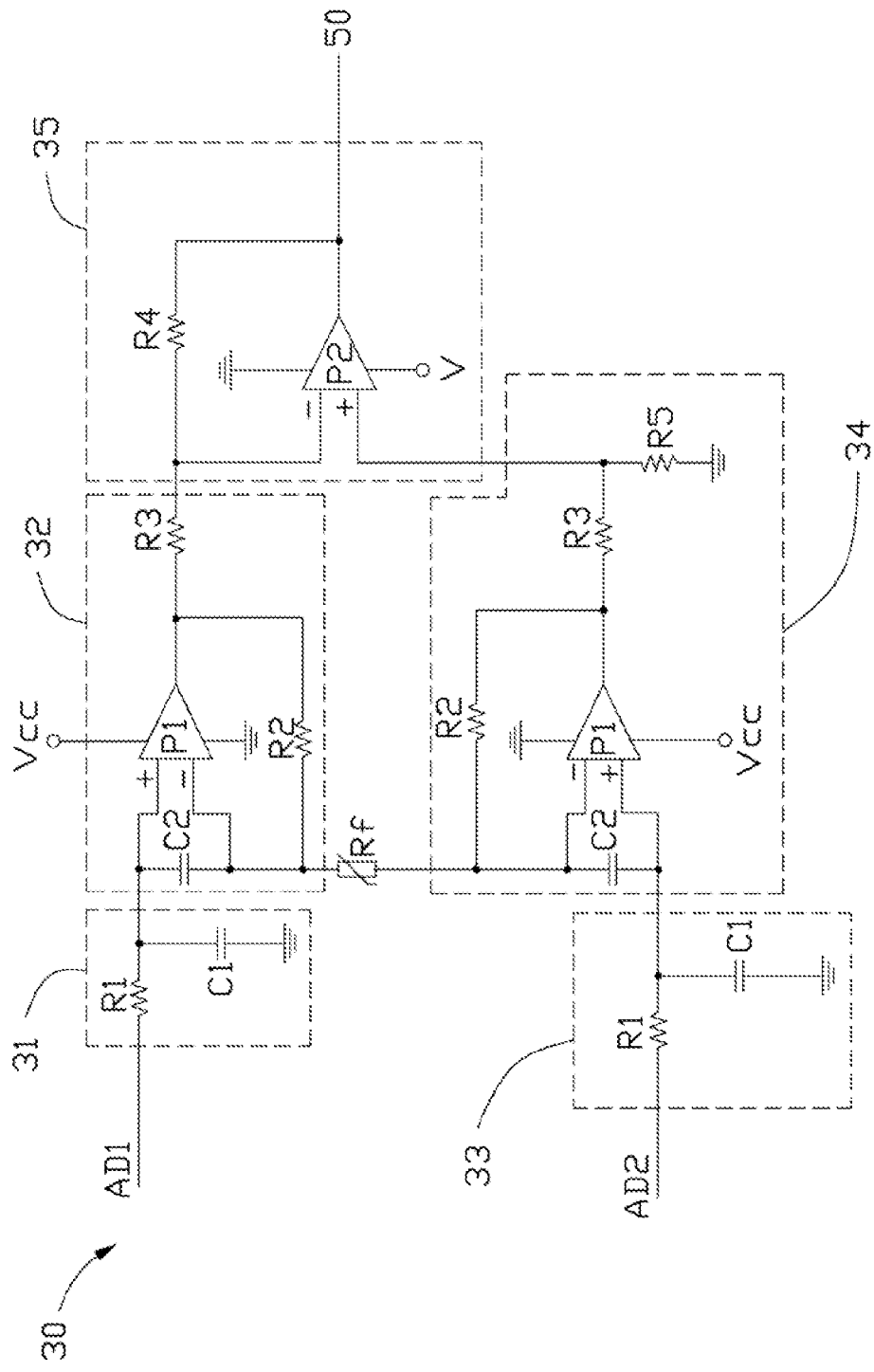
FIG. 3 is a circuit diagram of an amplifying circuit of the ON/OFF detection circuit of FIG. 1.

Referring to FIG. 3, the amplifying circuit 30 is configured for filtering and amplifying the sampled voltage between the AD1 terminal and the AD2 terminal. The amplifying circuit 30 includes a first filter circuit 31, a first buffer amplifying circuit 32, a second filter circuit 33, a second buffer amplifying circuit 34, a difference amplifying circuit 35, and a rheostat Rf. The first filter circuit 31 is coupled to the AD1 terminal. The first buffer amplifying circuit 32 is coupled to the first filter circuit 31. The second filter circuit 33 is coupled to the AD2 terminal. The second buffer amplifying circuit 34 is coupled to the second filter circuit 33. The rheostat Rf is connected between the first buffer amplifying circuit 32 and the second buffer amplifying circuit 34. The first buffer amplifying circuit 32 and the second buffer amplifying circuit 34 are coupled to the difference amplifying circuit 35. The difference amplifying circuit 35 is connected to the control circuit 50. The first filter circuit 31 and the second filter circuit 33 are configured for filtering the high frequency part of the sampled voltage. The first buffer amplifying circuit 32 and the second buffer amplifying circuit 34 are configured for transforming the electrical impedance of the sampled voltage output from the first filter circuit 31 and the second filter circuit 33 correspondingly. The difference amplifying circuit 35 is configured for amplifying the sampled voltage output from the first buffer amplifying circuit 32 and the second buffer amplifying circuit 34.

The first filter circuit 31 and the second filter circuit 33 respectively include a first resistor R1, and a first capacitor C1 connected in series to the first resistor R1. A first terminal of the first resistor R1 of the first filter circuit 31 is coupled to the AD1 terminal, while a first terminal of the first resistor R1 of the second filter circuit 33 is coupled to the AD2 terminal. The first capacitor C1 includes a first terminal coupled to the first resistor R1, and a second terminal grounded.

The first buffer amplifying circuit 32 and the second buffer amplifying circuit 34 each include a first amplifier P1, a second resistor R2, a second capacitor C2, and a third resistor R3. The first amplifier P1 includes a positive terminal connected to a second terminal of the first resistor R1, a negative terminal connected to a first terminal of the second resistor R2, and an output terminal connected to a second terminal of the second resistor R2. The second capacitor C2 is connected between the positive terminal and the negative terminal of the first amplifier P1. The third resistor R3 includes a first terminal connected to the output terminal of the first amplifier P1 and a second terminal. The rheostat Rf is connected between two negative terminals of the first amplifiers P1. In this embodiment, the second buffer amplifying circuit 34 further includes a fifth resistor R5. The fifth resistor R5 includes a first terminal coupled to the second terminal of the third resistor R3 of the second buffer amplifying circuit 34 and a second terminal grounded.

The difference amplifying circuit 35 includes a second amplifier P2, a fourth resistor R4, and a fifth resistor R5. The second amplifier P2 includes a negative terminal connected to the second terminal of the third resistor R3 of the first buffer amplifying circuit 32, a positive terminal connected to the second terminal of the third resistor R3 of the second buffer amplifying circuit 34, and an output terminal coupled to the control circuit 50. The fourth resistor R4 is connected between the negative terminal and the output terminal of the second amplifier P2. The fifth resistor R5 includes a first terminal connected to the positive terminal of the second amplifier P2 and a second terminal grounded.

Figure 4:
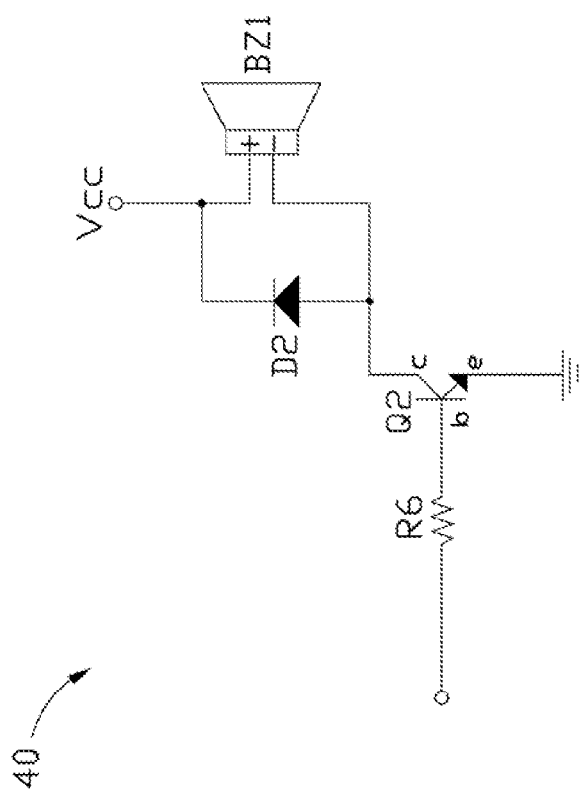
FIG. 4 is a circuit diagram of an alarm circuit of the ON/OFF detection circuit of FIG. 1.

Referring to FIG. 4, the alarm circuit 40 includes a sixth resistor R6, a second transistor Q2, a second diode D2, and a buzzer BZ1. The sixth resistor R6 includes a first terminal coupled to the control circuit 50. The second transistor Q2 is an NPN type, and includes a collector "c" coupled to an anode of the second diode D2, an emitter "e" grounded, and a base "b" coupled to a second terminal of the sixth resistor R6. A cathode of the second diode D2 is connected to the power source. The buzzer BZ1 includes a positive terminal connected to the cathode of the second diode D2, and a negative terminal coupled to the anode of the second diode D2.

The control circuit 50 includes a single chip processor with a test times and a comparison voltage preset therein. The comparison voltage defines a tolerance of acceptable range, such as ±5%, and the comparison voltage is varied according to the parameters of the electronic device 110 and the ON/OFF detection circuit 100. The control circuit 50 is used to control the connection and disconnection between the input terminal 12 and the output terminal 13 of the switch circuit 10 via the control terminal 11.

Before the ON/OFF detection, a power terminal of the electronic device 110 is coupled to the output terminal 13. When the control terminal 11 is input a high level signal output from the control circuit 50, and the input terminal 12 connects to the output terminal 13, the electronic device 110 is turned on. The current sampling circuit 20 inducts the current flowing to the electronic device 110 and converts the sampled current to a sampled voltage. The sampled voltage is filtered and amplified by the amplifying circuit 30, and then is output to the control circuit 50. The control circuit 50 converts the sampled voltage from an analog signal to a digital signal, and compares the sampled voltage with the comparison voltage. The control circuit 50 controls the alarm circuit 40 according to the comparing result. When the control terminal 11 is input a low level signal output from the control circuit 50, and the input terminal 12 disconnects from the output terminal 13, the electronic device 110 is turned off.

If the sampled voltage exceeds the acceptable range of the comparison voltage during the test, the electronic device is unqualified. If the sampled voltage locates in the acceptable range of the comparison voltage, the test times subtracts one. The electronic device 110 is repeatedly turned off and turned on via the ON/OFF detection circuit 100, meanwhile, the voltage is timely sampled and compared with the acceptable range of the comparison voltage. If the test times are exhausted but all of the sampled voltages are located in the acceptable range of the comparison voltage, the electronic device is qualified.

It will be understood that particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An ON/OFF detection circuit for detecting an electronic device, comprising:
    a switch circuit comprising an input terminal connected to a constant voltage source, an output terminal coupled to the electronic device, and a control terminal configured to control the connection and disconnection between the input terminal and the output terminal;
    a current sampling circuit connected between the input terminal and the output terminal of the switch circuit for sampling current flowing to the electronic device and converting the sampled current into a sampled voltage;
    an amplifying circuit configured for filtering and amplifying the sampled voltage; and
    a control circuit connected with the control terminal of the switch circuit and the amplifying circuit, the control circuit controlling ON and OFF of the electronic device and comparing the sampled voltage with a comparison voltage to judge whether the electronic device is qualified or disqualified;
    wherein the control circuit presets a number of test times, and the comparison voltage defines a tolerance of acceptable range; and if the sampled voltage is located in the acceptable range of the comparison voltage, the number of test times subtract one until the number is exhausted.

2. The ON/OFF detection circuit in claim 1, wherein the switch circuit comprises a first transistor and a relay; the first transistor is an NPN type, and comprises a collector, an emitter that is grounded, and a base as the control terminal of the switch circuit; the relay comprises an L1 terminal, an L2 terminal, a COM1 terminal, a COM2 terminal, an NO1 terminal, and an NO2 terminal; the L1 terminal is connected to the collector of the first transistor; the L2 terminal is connected to a power source; the COM1 terminal and the COM2 terminal are electrically interconnected to serve as the input terminal of the switch circuit; and the NO1 terminal and the NO2 terminal are electrically interconnected to serve as the output terminal of the switch circuit.

3. The ON/OFF detection circuit in claim 2, wherein the switch circuit further comprises a first diode, and the first diode comprises an anode and a cathode connected to the terminal and the terminal respectively.

4. The ON/OFF detection circuit in claim 3, wherein the switch circuit further comprises an inductor, a first capacitor, a second capacitor, and a third capacitor; the inductor comprises a first terminal coupled to the power source and a second terminal connected to a cathode of the first diode; and all of positive terminals of the first capacitor, the second capacitor, and the third capacitor are coupled to the cathode of the first diode, while all of negative terminals of the first capacitor, the second capacitor, and the third capacitor are grounded.

5. The ON/OFF detection circuit in claim 2, wherein the current sampling circuit comprises a current transformer and a sampling resistor; and the current transformer comprises a primary coil connected between the input terminal and the constant voltage source and a secondary coil connected in parallel with the sampling resistor.

6. The ON/OFF detection circuit in claim 5, wherein the amplifying circuit comprises a first filter circuit coupled to one terminal of the sampling resistor, a first buffer amplifying circuit coupled to the first filter circuit, a second filter circuit coupled to other terminal of the sampling resistor, a second buffer amplifying circuit coupled to the second filter circuit, and a rheostat connected between the first buffer amplifying circuit and the second buffer amplifying circuit, and the first buffer amplifying circuit and the second buffer amplifying circuit are coupled to a difference amplifying circuit connected to the control circuit.

7. The ON/OFF detection circuit in claim 1, further comprising an alarm circuit, wherein the alarm circuit is coupled to the control circuit.

8. The ON/OFF detection circuit in claim 7, wherein the alarm circuit comprises a second transistor and a buzzer; the second transistor is an NPN type, and comprises a collector connected to the negative terminal of the buzzer, an emitter being grounded, and a base coupled to the control circuit; and the positive terminal of the buzzer is connected to a power source.

9. The ON/OFF detection circuit in claim 8, wherein the alarm circuit further comprises a second diode, and the second diode comprises an anode and a cathode connected to the negative terminal and the positive terminal of the buzzer, respectively.

* * * * *